(12) United States Patent
Li

(10) Patent No.: US 10,446,673 B2
(45) Date of Patent: Oct. 15, 2019

(54) LATERAL INSULATED GATE BIPOLAR TRANSISTOR AND METHOD OF ELIMINATING THE TRANSISTOR TAIL CURRENT

(71) Applicant: UNIVERSITY OF ELECTRONIC SCIENCE AND TECHNOLOGY OF CHINA, Chengdu (CN)

(72) Inventor: Junhong Li, Chengdu (CN)

(73) Assignee: UNIVERSITY OF ELECTRONIC SCIENCE AND TECHNOLOGY OF CHINA, Chengdu (CN)

(*) Notice: Subject to any disclaimer, the term of this patent is extended or adjusted under 35 U.S.C. 154(b) by 0 days.

(21) Appl. No.: 16/021,046

(22) Filed: Jun. 28, 2018

(65) Prior Publication Data

US 2018/0308962 A1  Oct. 25, 2018

Related U.S. Application Data

(63) Continuation-in-part of application No. PCT/CN2016/111089, filed on Dec. 20, 2016.

(30) Foreign Application Priority Data

Dec. 28, 2015 (CN) .......................... 2015 1 0998522
Dec. 28, 2015 (CN) .......................... 2015 1 0999925

(51) Int. Cl.
*H01L 29/66* (2006.01)
*H01L 29/739* (2006.01)
(Continued)

(52) U.S. Cl.
CPC ...... *H01L 29/7393* (2013.01); *H01L 29/0878* (2013.01); *H01L 29/405* (2013.01); *H01L 29/7394* (2013.01); *H01L 29/7816* (2013.01)

(58) Field of Classification Search
CPC .................................................. H01L 29/7393
(Continued)

(56) References Cited

U.S. PATENT DOCUMENTS 6,091,107 A * 7/2000 Amaratunga ....... H01L 29/7397
257/133
2008/0265329 A1* 10/2008 Hirler ................. H01L 29/0619
257/367

(Continued)

FOREIGN PATENT DOCUMENTS

CN    101771073 A    7/2010
CN    102403341 A    4/2012
(Continued)

OTHER PUBLICATIONS

P.A. Gough, M. R. Simpson, and V. Rumenik, "Fast switching lateral insulated gate transistor," in IEDM Tech. Dig., 1986, pp. 218-221.

(Continued)

*Primary Examiner* — Ajay Arora
(74) *Attorney, Agent, or Firm* — Gokalp Bayramoglu

(57) ABSTRACT

A lateral insulated gate bipolar transistor (LIGBT) and method for eliminating the transistor tail current. The lateral insulated gate bipolar transistor comprises the silicon substrate, the buried oxide, and the drift region, the channel region, ohm-contact-high-doping region, the cathode, the gate dielectric, the anode contact, the gate, the cathode contact, the anode, which are placed above the silicon substrate, the electric field intensifier is placed at the upper surface of the drift region between the anode and the channel region to generate an electric field that starts from anode and points to the bottom surface of the electric field intensifier. The electric field intensifier is isolated from the drift region by the dielectric. The invention realizes performance (Continued)

improvements for both the conduction and the switching behaviors of the LIGBT device.

11 Claims, 6 Drawing Sheets

(51) Int. Cl.
*H01L 29/08* (2006.01)
*H01L 29/78* (2006.01)
*H01L 29/40* (2006.01)

(58) Field of Classification Search
USPC .......................................................... 257/141
See application file for complete search history.

(56) References Cited

U.S. PATENT DOCUMENTS

2011/0133718 A1* 6/2011 Watanabe ........... H01L 29/0615
323/311

2011/0215858 A1* 9/2011 Mauder ................ H01L 29/739
327/377
2013/0056824 A1 3/2013 Chu et al.

FOREIGN PATENT DOCUMENTS

| CN | 103268890 A | 8/2013 |
|---|---|---|
| CN | 103579230 A | 2/2014 |
| CN | 105590960 A | 5/2016 |

OTHER PUBLICATIONS

J. K. O. Sin, C. A. T. Salama, L. Z. Hou, "The SINFET—A Schottky injection MOS-gated device," IEEE Trans. Electron Devices, vol. ED-33, 1940, 1986.

P. Li, Y. Q. Li, and C. A. T. Salama, "A heterojunction bipolar transistor with a thin α-Si emitter," IEEE Trans. Electron Devices, vol. 41, No. 6, pp. 932-935, Jun. 1994.

* cited by examiner

LATERAL INSULATED GATE BIPOLAR TRANSISTOR AND METHOD OF ELIMINATING THE TRANSISTOR TAIL CURRENT

CROSS REFERENCE TO RELATED APPLICATIONS

This application is the continuation-in-part application of International Application No. PCT/CN2016/111089, filed on Dec. 20, 2016, which is based upon and claims priority to Chinese Patent Application No. 201510999925.6, filed on Dec. 28, 2015, and Chinese Patent Application No. 201510998522.X, filed on Dec. 28, 2015, the entire contents of which are incorporated herein by reference.

TECHNICAL FIELD

This invention relates to semiconductor power devices, in particular to the material and the structure of the dual-carrier power devices.

It is well known that in a conventional lateral dual-carrier power device, the conduction is realized by the mass electrons and holes introduced by the plasma injection effect. For instance, the Lateral Insulated Gate Bipolar Transistor (LIGBT), as a typical dual-carrier device, the both electrons and holes are utilized for the conduction, therefore, its on-resistance and on-state voltage-drop are much lower than that of the Metal Oxide Semiconductor (MOS) power device. Because the MOS device is a majority-carrier device, it therefore exhibits high on-resistance but fast switching speed. On contrast, as the LIGBT is a dual-carrier power device, there are extra electrons residing in the drift region, which causes extremely long anode-tail-current after the switching off. Excessive efforts had been devoted to the optimization of the anode tail current, for instance, the anode-short LIGBT [P. A. Gough, M. R. Simpson, and V. Rumenik, "Fast switching lateral insulated gate transistor," in IEDM Tech. Dig., 1986, pp. 218-221]; the SINFET [J. K. O. Sin, C. A. T. Salama, L. Z. Hou, "The SINFET-A Schottky injection MOS-gated device," IEEE Trans. Electron Devices, vol. ED-33, 1940, 1986]; SiGe anode LIGBT [P. Li, Y Q. Li, and C. A. T. Salama, "A heterojunction bipolar transistor with a thin α-Si emitter," IEEE Trans. Electron Devices, vol. 41, no. 6, pp. 932-935, June 1994], etc. It is possible to reduce the duration of the LIGBT tail-current by confining the plasma injection efficiency or reducing the carrier lifetime. As a result, the density of electrons residing in the drift region is reduced at the turning off state, which is the idea for most of the conventional methods as the literatures previously mentioned. However, as the convention means improves the switching speed by confining the on-state current, which causes smaller the device current density and bring extra on-state loss. Moreover, the conventional methods can only reduce the duration of the LIGBT tail-current instead of completely eliminating it.

SUMMARY

The purpose of this invention is to provide an ultra-fast lateral insulated gate bipolar transistor with high current capability, which significantly boosts the on-state current density by increasing the carrier density.

The additional purpose of this invention is to provide a method to significantly increase the switching speed and completely eliminate the anode tail current after the device switching-off.

The technical solution of this invention is to use the novel device structure of ultra-fast lateral insulated gate bipolar transistor with high current capability, comprising the silicon substrate 1, the drift region 2, channel region 3, ohm-contact-high-doping region 4, cathode 5, gate dielectric 8, anode contact 10, gate 11, cathode contact 12, anode 13, and buried oxide 18;

An electric field intensifier 20 is placed on the upper surface of the drift region 2, whose projection on the drift region 2 locates between that of the anode 13 and channel region 3; said the function of electric field intensifier 20 is to generate an electric field that starts from the anode 13 and points to the bottom surface of the electric field intensifier 20 at the device on-state and switching process;

The electric field intensifier 20 is isolated from the drift region 2 by the dielectric 6.

The electric field intensifier 20 comprises:

The high-resistance-conduction region 7,

The acceleration-gate region 15, which contacts the high-resistance-conduction region 7 at the side of the anode 13, The ground region 16, which contacts the High-resistance-conduction region 7 at the side of the channel region 3, The acceleration gate 9, which contacts the acceleration-gate region 15, The ground electrode 17, which contacts the ground region 16.

Moreover, the material of the acceleration-gate region 15 is N type semiconductor, the material of the ground region 16 is P type semiconductor.

The projection of the acceleration-gate region 15 on the upper surface of the drift region 2 tangents or partially overlaps with that of the anode 13.

Said the projection of the ground region 16 on the upper surface of the drift region 2 tangents to or that of the channel region 3.

The distance between the projection of the ground region 16 and the channel region 3 on the upper surface of the drift region 2 is equal to or larger than zero.

Furthermore, said the electric field intensifier 20 is embedded into the dielectric 6, the dielectric 6 isolates the electric field intensifier 20 from the other parts of the transistor.

A method that eliminating the tail current of the transistor is provided by this invention, said the transistor is the Lateral Insulated Gate Bipolar Transistor (LIGBT), said the method includes following steps:

1) An electric field that starts from the anode 13 and points to the bottom surface of the electric field intensifier 20 is generated inside of the drift region 2 by the ground-biasing of the both acceleration gate 9 and gate 11; at that moment, the transistor shifts from conducting to blocking.

2) A sharply rising voltage is introduced at the acceleration gate 9 while keeping the gate 11 grounded, the voltage keep rising until the transistor is fully switched-off.

Contrary to the conventional LIGBT devices, which boost the switching speed by confining the carrier-density at the device on-state, this invention eliminates the anode-tail-current by substantially increasing the carrier-density at the device on-state, therefore, this invention realizes the simultaneously performance improvements of LIGBT for both on-state current density and switching speed.

DETAILED DESCRIPTION OF THE EMBODIMENTS

Figure 1:
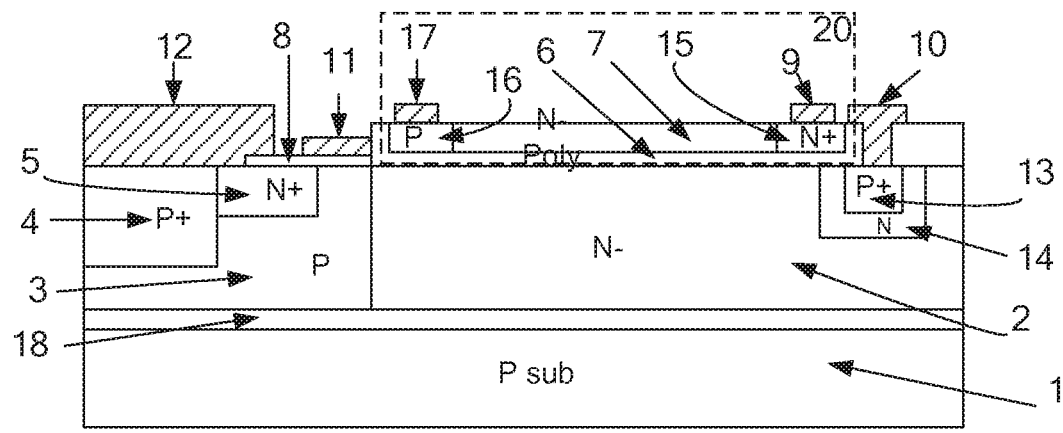
FIG. 1 is the device cross-section-view for the embodiment 1.

Provided is an ultra-fast lateral insulated gate bipolar transistor with high current capability, comprising the silicon substrate 1, the drift region 2, channel region 3, ohm-contact-high-doping region 4, cathode 5, gate dielectric 8, anode contact 10, gate 11, cathode contact 12, anode 13, the electric field intensifier 20 is placed at the upper surface of the drift region 2 between anode 13 and channel region 3, said the electric field intensifier 20 generates an electric field that starts from anode 13 and points to the bottom surface of the electric field intensifier 20, this electric field is capable of eliminating the tail at device turn-off process and reducing energy loss at the device on-state.

The electric field intensifier 20 is isolated from the drift region 2 by the dielectric 6.

Specifically, the ultra-fast lateral insulated gate bipolar transistor with high current capability, comprising the silicon substrate 1, the drift region 2, anode 13, channel region 3, ohm-contact-high-doping region 4, cathode 5, gate 11, gate dielectric 8, anode contact 10, cathode contact 12, buffer 14; the drift region 2, the butler 14, the cathode 5 are the N type semiconductor; substrate 1, channel region 3, ohm-contact-high-doping region 4, anode 13 are the P type semiconductor; the electric field intensifier 20 is placed at the upper surface of the drift region 2 and buffer 14, which partially or fully covers on the drift region 2 and buffer 14, the electric field intensifier is also extendable to the anode 13 and channel region 3.

The dielectric 6 isolates the electric field intensifier 20 from the other parts of the transistor. The electric field intensifier 20 comprises the high-resistance-conduction region 7, the acceleration-gate region 15, the ground region 16, the acceleration gate 9, and the ground electrode 17. The acceleration-gate region 15 is placed in the high-resistance-conduction region 7 at the side of the anode contact 10, the acceleration gate 9 contacts the acceleration-gate region 15, the ground region 16 is placed in the high-resistance-conduction region 7 that at the side of the gate 11, the ground electrode 17 contacts the ground region 16, the ground region 16 and the acceleration-gate region 15 is isolated from gate 11 and anode contact 10, respectively.

A tangency or partial overlap is reached between the projection of the acceleration-gate region 15 and the projection of anode 13 over the upper surface of the drift region 2. Whereas the distance between the projection of the ground region 16 and the channel region 3 on the upper surface of the drift region 2 is equal to or larger than zero. The possible materials for the dielectric 6 includes conventional gate dielectric or high permittivity material, the material for the high-resistance-conduction region 7 may be the silicon crystalline or the polysilicon, the doping type may be N type or P type, the material of the acceleration-gate region 15 may be crystalline or the polysilicon, the material of the ground region 16 may be silicon crystalline or the polysilicon. The doping type of the acceleration-gate region 15, the ground region 16, and the high-resistance-conduction region 7 are the N or P type semiconductor, the doping type of the acceleration-gate region 15, the ground region 16, and the high-resistance-conduction region 7 may be the same or different with each other, the doping concentration of the acceleration-gate region 15 and the ground region 16 are the same or higher than the doping concentration of the high-resistance-conduction region 7.

Figure 2:
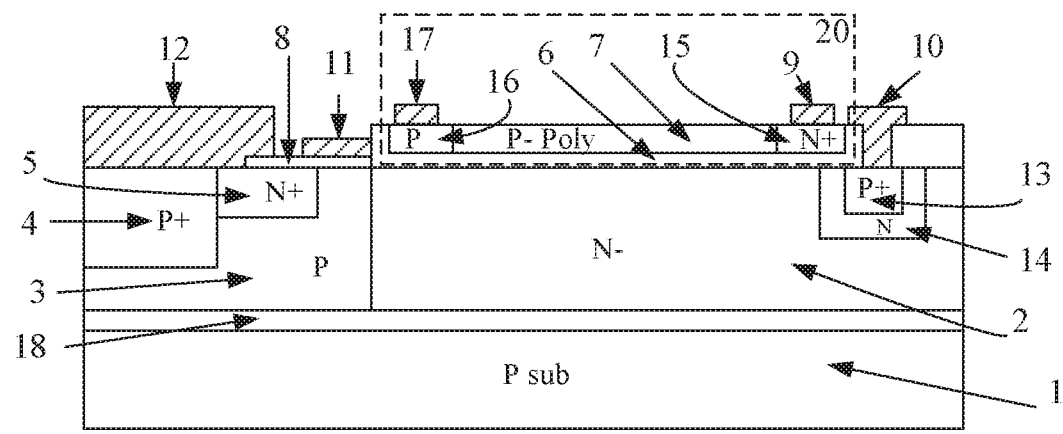
FIG. 2 is the device cross-section-view for the embodiment 2.
Figure 3:
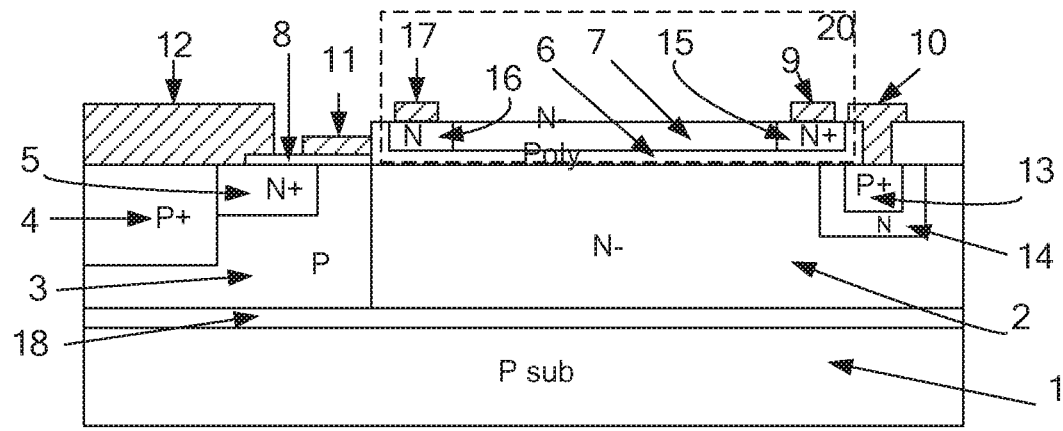
FIG. 3 is the device cross-section-view for the embodiment 3.

As shown in FIGS. 1, 2 and 3, the device in this invention comprises the silicon substrate 1, the drift region 2, anode 13, channel region 3, ohm-contact-high-doping region 4, cathode 5, gate 11, gate dielectric 8, anode contact 10, cathode contact 12, buffer 14; the drift region 2, the buffer 14, cathode 5 are the N type semiconductor; substrate 1, channel region 3, ohm-contact-high-doping region 4, anode 13 are the P type semiconductor; the electric field intensifier 20 is placed at the upper surface of the drift region 2 and buffer 14, which cover partially or fully on the drift region 2 and buffer 14, the electric field intensifier is also extendable to the anode 13 and channel region 3. The electric field intensifier 20 comprises the high-resistance-conduction region 7, the acceleration-gate region 15, the ground region 16, the acceleration gate 9, and the ground electrode 17. The acceleration-gate region 15 locates at side of the anode contact 10 in the high-resistance-conduction region 7, the acceleration gate 9 contacts the acceleration-gate region 15, the ground region 16 locates at the side of the gate 11 in the high-resistance-conduction region 7, the ground electrode 17 contacts the ground region 16, the ground region 16 and the acceleration-gate region 15 isolated with gate 11 and anode contact 10, respectively. A tangency or partial overlap is reached between the projection of the close-to-the-anode rim of the acceleration-gate region 15 and the projection of anode 13 over the upper surface of the drift region 2. The distance between the projection of the ground region 16 and the channel region 3 on the upper surface of the drift region 2 is equal to or larger than zero.

A typical embodiment is as shown in FIG. 1, which uses the silicon crystalline as the substrate 1; the high-resistance-conduction region 7 is the lightly doped N type semiconductor, the acceleration-gate region 15 is the heavily doped N type semiconductor, the ground region 16 is the P type semiconductor with medium doping; the material of the high-resistance-conduction region 7, the acceleration-gate region 15, and the ground region 16 are the polysilicon. When the device is at the blocking state, the anode experiences high voltage while the gate 11 and cathode are grounded, as this moment, the voltage on the acceleration gate 9 need to be set as high as the anode 13; meanwhile, the ground electrode 17 is grounded. The device of the invention at the blocking state is similar as the conventional LIGBT with the same mechanism. If the high-permittivity material is used as the dielectric 6, because of the potential modulation effect, the potential distribution in the drift region will be more uniform, therefore, the breakdown voltage is further improved compared to the conventional LIGBT.

Figure 10:
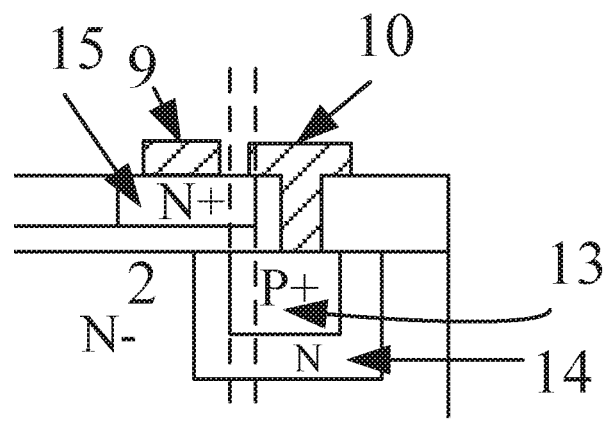
FIG. 10 is the illustration for the projection of the acceleration-gate region 15 and anode 13 for the device in the FIG. 1.
Figure 11:
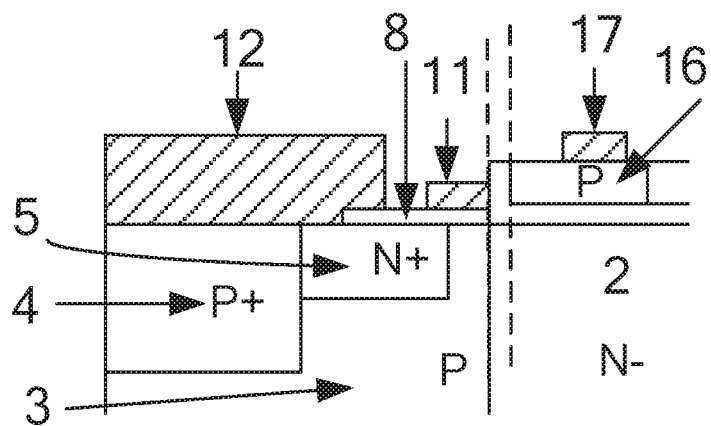
FIG. 11 is the illustration for the projection of the ground region 16 and channel region 3 for the device in the FIG. 1.

When the voltage on the gate 11 goes high, the electron channel that connecting the drift region 2 and cathode 5 is formed in the channel region 3, the device operates in the conduction mode. Like the conventional LIGBT, the plasma injection effect exists in the device of this invention, the conduction mode is therefore the dual-carrier mode with both electron and hole carriers. For this invention, the acceleration gate 9 and the ground electrode 17 are grounded or negatively biased at the device on-state. As a result, the voltage on the ground region 16, the high-resistance-conduction region 7, the acceleration-gate region 15 are also grounded or negative biased, the electric field intensifier 20 will play its role by introducing an electric field inside of the drift region 2 that starts from the anode 13, passes though the drift region 2, buffer 14 and dielectric 6, and points to the ground region 16, the high-resistance-conduction region 7 and the acceleration-gate region 15, i.e. the bottom surface of the electric field intensifier 20. This electric field enables more hole-carriers to move into the drift region 2 from the anode 13 with the force of that electric field. The detailed mechanism is as below: because the electric field intensifier 20 covers on the both of the drift region 2 and buffer 14, it is also extendable to the anode 13 and channel region 3 (as FIG. 10 and FIG. 11 show), hence, a electric field that starts from the anode 13, points to the bottom surface of the electric field intensifier 20 is generated, which amplifies the plasmas injection effect from the anode 13 besides its natural plasma injection effect, the density of the hole-carrier in the drift region 2 and buffer 14 are therefore significantly boosted with the effect of the electric field brought by the electric field intensifier 20. With the higher hole-carrier density, the electron-carrier density is also increased; therefore, the on-state current density for the device in this invention is significantly boosted. In a word, the conventional LIGBT only relies on the natural plasma injection from the P+ anode 13 to the N− drift region whereas the device in this invention uses the electric field intensifier 20 to amplify the anode injection efficiency on the basis of the natural plasma injection from the anode 13, as a result, the hole-carrier density is significantly boosted, and the on-state current density of the device in this invention is much higher than that of the conventional LIGBT device.

Although the device in this invention has some similarities with the patents CN201110274680.2 and CN201310202668.X, however, the structure and the mechanism are totally different. The polysilicon or silicon crystalline covered on the drift region in the both of the above mentioned patents is used as the field plate, whose function does not go beyond the optimization of the potential distribution in the drift region to enable higher drift region doping concentration and larger breakdown voltage at the blocking state for either LDMOS or LIGBT. On contrast, the electric field intensifier 20 in this invention is not only used as the field plate for the purpose of breakdown voltage improvement at the blocking state, but also amplifies the plasma injection efficiency and velocity of the hole carriers to realize higher on-state current density. Therefore, the acceleration gate 9, which is capable of providing the ground potential for the electric field intensifier 20 at the device on-state, is an indispensable component of the device in this invention. Whereas the acceleration gate 9 does not exist in the above mentioned patents.

When the device in this invention shifts from the conduction to the blocking, the voltage on the gate 11 is firstly grounded; the electron channel in the channel region 3 immediately disappears. For the conventional LIGBT, as there are extra electrons remaining in the drift region 2, a long lasting tail current will happen after the turning-off. However, in this invention, as the voltage on the acceleration gate 9 still remains grounded, the potential of the electric field intensifier 20 is low; consequently, the electric field from the anode 13 to surface of the drift region 2 and buffer 14 still exists, the holes therefore current keep flowing from the anode 13 to the cathode 12 through the buffer 14, drift region 2 and channel region 3. As a result, the electrons remaining in the drift region is rapidly neutralized by the hole current. After that, the voltage on the acceleration gate 9 is immediately pulled to the high voltage by the external driving circuit, as a parasitic capacitor exists between the acceleration gate 9 and anode contact 10, moreover, a tangency or partially overlap is reached between the projection of the close-to-the-anode rim of the acceleration-gate region 15 on the upper surface of the drift region 2 with that of the anode 13. As a result, the sudden voltage raised on the acceleration gate 9 immediately couples to the anode contact 10 though the parasitic capacitor, so that the voltage on the anode contact 10 completely follows the acceleration gate 9 and enables the fast turn-off of the device, which is the ultimate solution for the speed problem of the conventional LIGBT.

MORE DETAILED DESCRIPTION OF PREFERRED EMBODIMENTS

Embodiment 1

As shown in FIG. 1, FIG. 10 and FIG. 11. This embodiment uses the P−, N−, P+, N, P, N+, P+ doped silicon as material for the substrate 1, drift region 2, anode 13, butler 14, channel region 3, cathode 5, ohm-contact-high-doping region 4, respectively. The electric field intensifier 20 is placed at the surface of both drift region 2 and buffer 14, in which the lightly N doped polysilicon is used as the material for the high-resistance-conduction region 7, and the N+ doped polysilicon is used as the acceleration-gate region 15, the acceleration gate 9 directly contacts the acceleration-gate region 15, the ground region 16 is P type semiconductor with medium doping concentration.

When the device is in the blocking state, there is high voltage on the anode 13, whereas the gate 11 and cathode 5 are grounded. At this moment, the acceleration gate 9 needs to be set at the same voltage of the anode 13, while the ground electrode 17 is grounded. A reversely biased PiN diode is formed by the acceleration-gate region 15, high-resistance-conduction region 7, and the ground region 16, the high-resistance-conduction region 7 will be depleted so that no current flows from the acceleration gate 9 to the ground electrode 17. The mechanism for device at the blocking state in this invention is the same as that of the conventional LIGBT. If the high permittivity material is used as the material of dielectric 6, the potential distribution will be more uniform for this device due to the potential modulation effect; therefore, its breakdown voltage is further enhanced compared to the conventional LIGBT.

The conduction-channel that connecting the drift region 2 and cathode 5 is formed at the channel region 3 when the voltage is applied on the gate 11, at this moment, the device enters the conduction mode. Like the conventional LIGBT, the plasma injection effect exists in the drift region, the conduction mode is therefore the dual-carrier conduction with both holes and electrons carriers. Because the electric field intensifier 20 covers the surface of both drift region 2 and buffer 14, together with its extendibility into anode 13 or channel region 3, a partial overlap or tangency between the projection of electric field intensifier 20 and the projection of anode 13 on the upper surface plane of drift region 2 is achieved, the distance between the projection of the ground region 16 and the channel region 3 on the upper surface of the drift region 2 is equal to or larger than zero (as shown in the FIG. 10, 11). At the device on-state, the acceleration gate 9 and the ground electrode 17 are grounded, the voltage on all of the ground region 16, the high-resistance-conduction region 7, and the acceleration-gate region 15 are lower than that of the anode 13, as a result, an electric field is introduced into the drift region 2, which starts from the anode 13, passes though the drift region 2, buffer 14 and dielectric 6, and points to the ground region 16, the high-resistance-conduction region 7 and the acceleration-gate region 15. This electric field enables more hole-carriers to move into the drift region from the anode 13 with the force of the electric field, hence, besides the natural plasma injection effect from the anode, with the effect of the electric field intensifier 20, the plasma injection effect is amplified, and the density of the hole carrier in drift region 2 is significantly boosted, so too is the electron density. The current density is increased, which enables the device in this invention to exhibits much low conduction energy loss than that of the conventional LIGBT device.

When the device in this invention shifts from conduction to blocking, the voltage of the gate 11 is firstly grounded; the conduction channel in the channel region 3 therefore immediately disappears. For conventional LIGBT, as there are extra electrons remaining in the drift region 2, a long lasting tail current will exist after turning-off. However, in this invention, due to the existence of electric field intensifier 20, the electric field from the anode 13 to dielectric 6 therefore still exists because the voltage on the acceleration gate 9 still remains ground. Consequently, the holes current still flows, and the density of holes keeps high; as a result, the electrons remaining in the drift region is rapidly neutralized by the hole current. After that, the voltage of the acceleration gate 9 is immediately pulled to the high voltage by the external driving circuit, because there is a parasitic capacitor exists between the acceleration gate 9 and anode contact 10, and a tangency or partial overlap is reached between the projection of the close-to-the-anode rim of the acceleration-gate region 15 and the projection of anode 13 over the upper surface of the drift region 2, the sudden voltage rise on the acceleration gate 9 immediately couples to the anode contact 10 though the parasitic capacitor, so that the voltage on the anode contact 10 completely follows the acceleration gate 9 and brings the fast turn-off behavior of the device. The ground electrode 17 always remains grounded at both conduction and blocking state.

Embodiment 2

As shown in FIG. 2. This embodiment uses the P−, N−, P+, N, P, N+, P+ doped silicon as material for the substrate 1, drift region 2, anode 13, buffer 14, channel region 3, cathode 5, ohm-contact-high-doping region 4, respectively. The electric field intensifier 20 is placed at the surface of both drift region 2 and buffer 14, in which the lightly P doped polysilicon is used as the material for the high-resistance-conduction region 7, and the N+ doped polysilicon is used as the acceleration-gate region 15, the acceleration gate 9 directly contacts the acceleration-gate region 15, the ground region 16 is P type semiconductor with medium doping concentration.

The device in this embodiment on-state exhibits the same on-state and turn-off behaviors as that of the embodiment 1. However, as the P doped polysilicon is used as the material for the high-resistance-conduction region 7, a electric-field peak is introduced into the drift region 2 by the reversely biased PN junction of the electric field intensifier 20 at the device blocking state. As this peak field is close to the anode 13, therefore, it is capable of compensation the peak field at the interface of the channel region 3 and drift region 2. As a result, the breakdown voltage in this embodiment is higher than that of the embodiment 1.

Embodiment 3

As shown in FIG. 3. This embodiment uses the P−, N−, P+, N, P, N+, P+ doped silicon as material for the substrate 1, drift region 2 anode 13, buffer 14, channel region 3, cathode 5, ohm-contact-high-doping region 4, respectively. The electric field intensifier 20 is placed at the surface of both drift region 2 and buffer 14, in which the lightly N doped polysilicon is used as the material for the high-resistance-conduction region 7, the doping of the acceleration-gate region 15 and the ground region 16 are the same as that of the high-resistance-conduction region 7, the acceleration gate 9 and the ground electrode 17 are placed at the each points of the high-resistance-conduction region 7 that close to the gate 11 and anode 13, respectively.

At the device blocking state, leakage current flows from the acceleration gate 9 to the ground electrode 17 through the high-resistance-conduction region 7, therefore, the high-resistance-conduction region 7 becomes a resistive field plate, which makes the potential distribution in drift region 2 more uniform, and relaxes the requirements for the permittivity if the dielectric 6. This embodiment improves the device performance by electric field intensifier 20 and external electric field, whose mechanism for device conduction and switching are the same as the embodiment 1. As the same doping type is used for the high-resistance-conduction region 7, the acceleration-gate region 15, and the ground region 16, the leakage current will exist if the driving method for embodiment 1 is used, whereas the fabrication process is easier compared to the embodiment 1. On the other hand, the leakage current can be avoided by changing the driving method of the acceleration gate 9. When the device is in the on-state, the voltage on the acceleration gate 9 is low; when the device is shifting from on to off the voltage on acceleration gate 9 changes from low to high, once the device is fully turned off, the acceleration gate 9 becomes the floating. Using this method, there is no leakage current for the device, but adds the complexity for the external driving circuit.

Embodiment 4

Figure 4:
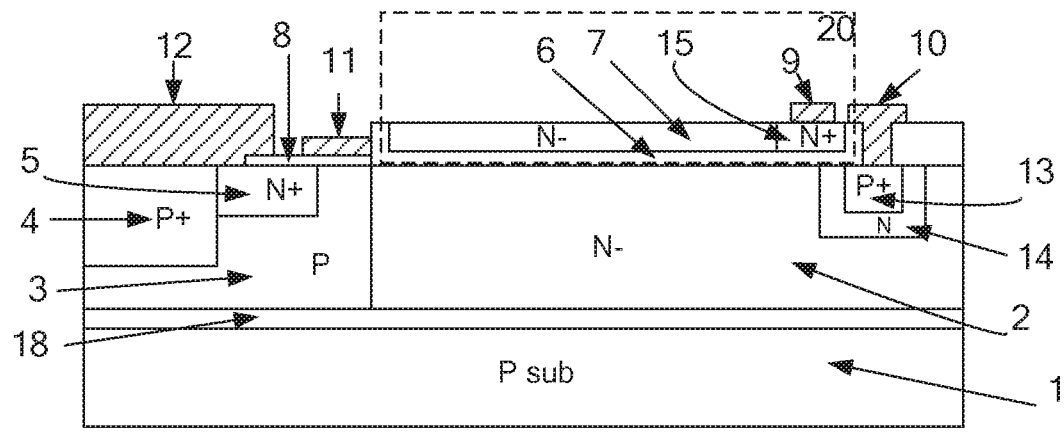
FIG. 4 is the device cross-section-view for the embodiment 4.

As shown in FIG. 4. This embodiment uses the P−, N−, P+, N, P, N+, P+ doped silicon as material for the substrate 1, drift region 2 anode 13, buffer 14, channel region 3, cathode 5, ohm-contact-high-doping region 4, respectively. The electric field intensifier 20 is placed at the surface of both drift region 2 and buffer 14, in which the lightly N doped silicon crystalline is used as the material for the high-resistance-conduction region 7, the doping of the acceleration-gate region 15 is same as that of the high-resistance-conduction region 7, the acceleration gate 9 is placed at the side that close to the anode on the high-resistance-conduction region 7.

As this embodiment uses the lightly doped silicon crystalline as the high-resistance-conduction region 7, the ground region 16 and the ground electrode 17 are not needed. The acceleration gate 9 locates at the high voltage as anode contact 10 at the device blocking state, the high-resistance-conduction region 7 is depleted, and the potential in the drift region 2 will be uniformly distributed, which guarantees the high breakdown voltage of the device. This embodiment improves the device performance by electric field intensifier 20 and external electric field, whose mechanism for the device conduction and switching is same as the embodiment 1. At the device on-state, the acceleration gate 9 is grounded or negatively biased, and the potential of the high-resistance-conduction region 7 is also low; the electric field intensifier 20 will play its role, which introduces massive hole-carriers into the drift region 2. When the device is shifting from the conduction to the blocking, both gate 11 and acceleration gate 9 are grounded or negatively biased, the electrons remaining in the drift region is rapidly neutralized by the hole current; after that, the voltage of the acceleration gate 9 is immediately pulled to the high voltage by the external driving circuit, the voltage on the acceleration gate 9 couples to the anode contact 10, which realizes the fast switching-off for the device. When the device is in the on-state, this embodiment allows the negative-bias of the acceleration gate 9, which further enhances the effect of the 20, more holes and electrons carriers are introduced into the drift region, which further increases the on-state current density.

As the lightly doped silicon crystalline is used as the high-resistance-conduction region 7, the deposition of the silicon crystalline on the dielectric 6 is required, which adds difficulties for the fabrication. Whereas this embodiment has one less electrode that simplifies the device structure and external driving circuit. Moreover, the negative voltage on the acceleration gate 9 is allowed at the on-state without the leakage current, the anode mass injection effect is further amplified so that the current density is further boosted at the on-state. Compared to the Embodiment 3, this embodiment is free of the leakage current in the electric field intensifier 20.

Embodiment 5

Figure 5:
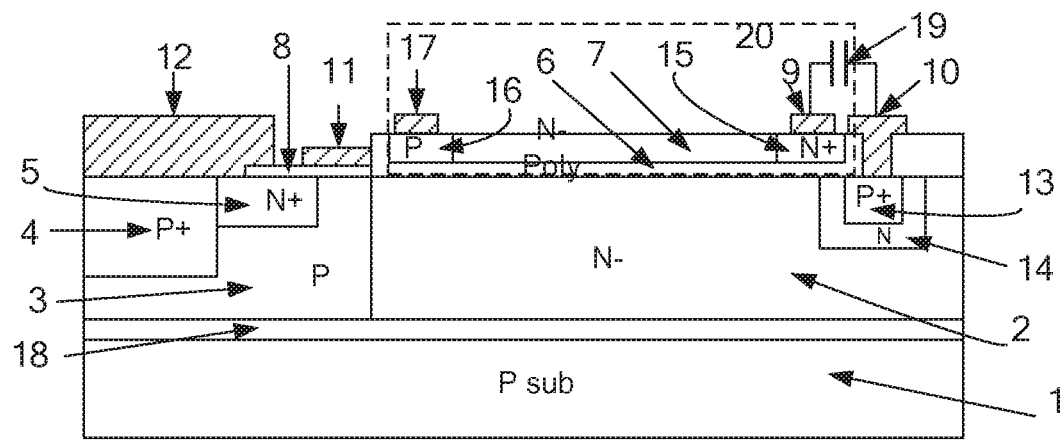
FIG. 5 is the device cross-section-view for the embodiment 5.

As shown in FIG. 5. In the said embodiments above, if the material with lower permittivity is used as the dielectric 6, the parasitic capacitor between acceleration gate 9 and the anode contact 10 is going to be small, which causes the voltage changes on the anode contact 10 lag behind the acceleration gate 9. In this embodiment, an external capacitor 19 between the acceleration gate 9 and the anode contact 10 is added in the said embodiments above to compensate the small capacitance of that parasitic capacitor. The capacitor 19 is a discrete device or an integrated device that integrated on the same chip of the power device.

Embodiment 6

Figure 6:
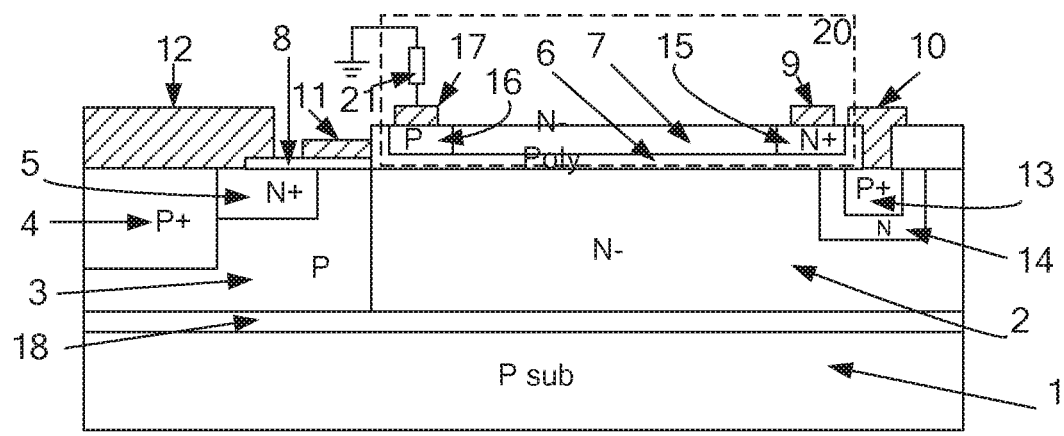
FIG. 6 is the device cross-section-view for the embodiment 6.

As shown in FIG. 6. In the said embodiments above, the leakage current exists between the acceleration gate 9 and ground electrode 17 on the electric field intensifier 20 at the device blocking state, which causes extra energy losses. In this embodiment, an external resister 21 connecting the ground and the ground electrode 17 is added in the said embodiments above to limit the leakage current. The resister 21 is a discrete device or an integrated device that integrated on the same chip of the power device.

Embodiment 7

Figure 7:
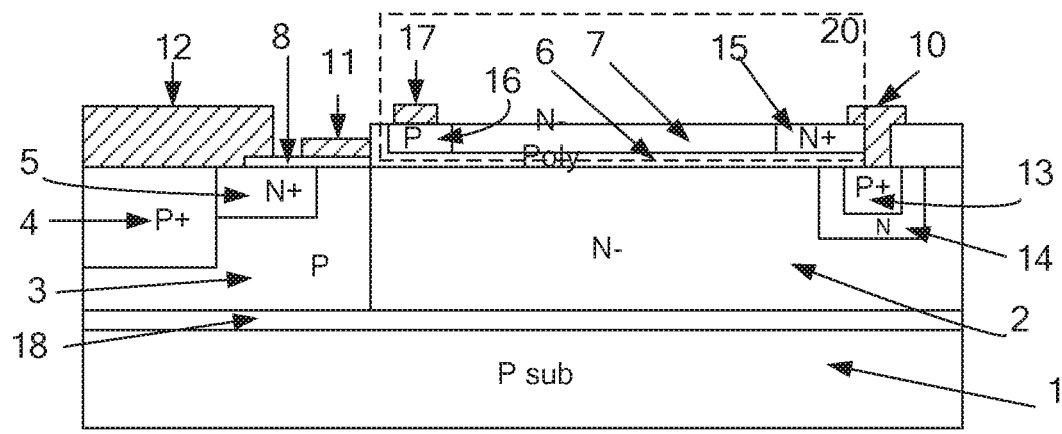
FIG. 7 is the device cross-section-view for the embodiment 7.

As shown in FIG. 7. This embodiment uses the P−, N−, P+, N, P, N+, P+ doped silicon as material for the substrate 1, drift region 2 anode 13, buffer 14, channel region 3, cathode 5, ohm-contact-high-doping region 4, respectively. The electric field intensifier 20 is placed at the surface of both drift region 2 and buffer 14. The electric field intensifier 20 comprises the high-resistance-conduction region 7, the acceleration-gate region 15, the ground region 16, and the ground electrode 17. The possible materials for all the high-resistance-conduction region 7, the acceleration-gate region 15, and the ground region 16 includes silicon crystalline and polysilicon. The doping type for the high-resistance-conduction region 7, the acceleration-gate region 15, and the ground region 16 can be either P or N type, the doping concentration may be either the same or different. The ground region 16 is isolated from the gate 11, and the acceleration-gate region 15 directly contacts the anode contact 10.

Because there is no acceleration gate 9 in the electric field intensifier 20 for this embodiment, its turn-off characteristics is similar to the conventional LIGBT, i.e. the tail current still exist. However, with the existence of the ground electrode 17, the potential in the electric field intensifier 20 at the side of the gate 11 is low, which also introduces an electric field that start from the anode 13 to the electric field intensifier 20, therefore the plasma injection effect is amplified and the current density is also boosted. Although this embodiment has no improvement for the device turn-off characteristics, whereas the number of electrodes for the device is only three, which can be driven by the conventional LIGBT driving circuit, but the conduction current density is significantly boosted compared with the conventional LIGBT.

Embodiment 8

Figure 8:
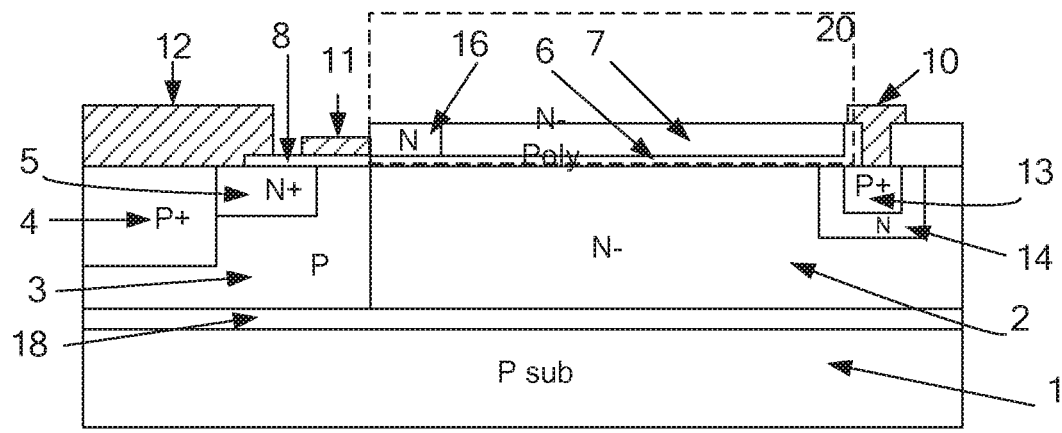
FIG. 8 is the device cross-section-view for the embodiment 8.

As shown in FIG. 8. This embodiment uses the P−, N−, P+, N, P, N+, P+ doped silicon as material for the substrate 1, drift region 2 anode 13, buffer 14, channel region 3, cathode 5, ohm-contact-high-doping region 4, respectively. The electric field intensifier 20 is placed at the surface of both drift region 2 and buffer 14. The electric field intensifier 20 comprises the high-resistance-conduction region 7 and the ground region 16. The possible materials for the high-resistance-conduction region 7 and the ground region 16 includes silicon crystalline and polysilicon. The doping type for the high-resistance-conduction region 7 and the ground region 16 includes P or N type, and their doping concentrations may be either the same or different. The high-resistance-conduction region 7 is isolated from the anode contact 10, and the ground region 16 directly contacts the gate 11.

As there are no acceleration gate 9 and the ground electrode 17 in the electric field intensifier 20 for this embodiment, its turn-off characteristics is similar to the conventional LIGBT, i.e. the tail current still exist. When the device is in the conduction mode, the voltage on the gate 11 transmits to the high-resistance-conduction region 7 through the ground region 16, an electric field that starts from the high-resistance-conduction region 7, points to the upper surface of the drift region 2 is generated. Although this electric field is unable to amplify the plasma injection effect from the anode 13, whereas mass electron carriers are absorbed to the surface of the drift region 2. As a result, the accumulation effect happens and the device current density is also significantly boosted. Although this embodiment has no improvement for the device turn-off characteristics, whereas there are only three electrodes for the device, which can be driven by the conventional LIGBT driving circuit, but the conduction current density is significantly boosted compared with the conventional LIGBT. The effect of this embodiment is similar to the Embodiment 7, whereas the mechanism in this embodiment is the accumulation effect instead of the plasma injection amplification for the Embodiment 7.

Embodiment 9

Figure 9:
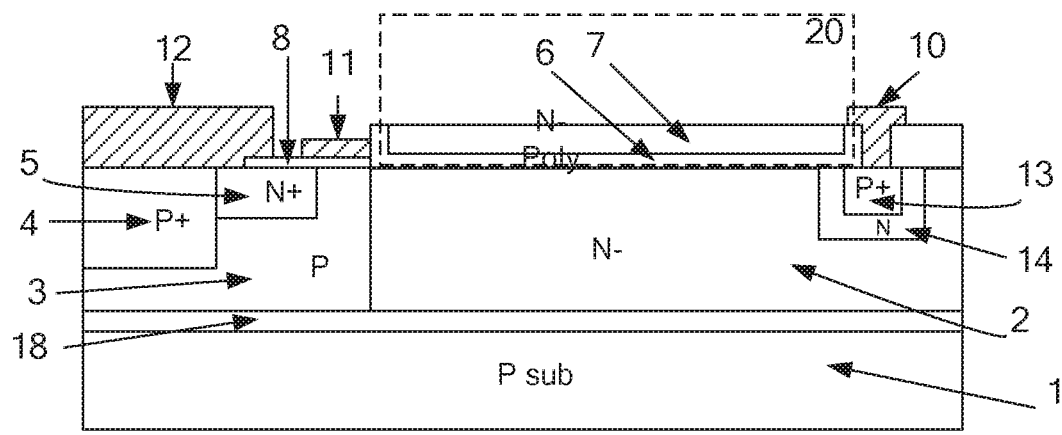
FIG. 9 is the device cross-section-view for the embodiment 9.

As shown in FIG. 9. This embodiment uses the P−, N−, P+, N, P, N+, P+ doped silicon as material for the substrate 1, drift region 2 anode 13, buffer 14, channel region 3, cathode 5, ohm-contact-high-doping region 4, respectively. The electric field intensifier 20 is placed at the surface of both drift region 2 and buffer 14. The electric field intensifier 20 only comprises the high-resistance-conduction region 7. The doping type for the high-resistance-conduction region 7 includes P or N type, the doping concentration may be either the same or different. The high-resistance-conduction region 7 is isolated from the gate 11 and the anode contact 10.

As there is no acceleration gate 9 in the electric field intensifier 20 for this embodiment, its turn-off characteristics is similar to the conventional LIGBT, i.e. the tail current still exist. The high-resistance-conduction region 7 in this embodiment is floating, as a result, when the device is in the on-state, the potential on the high-resistance-conduction region 7 may be high or low. If the potential on the high-resistance-conduction region 7 is high, massive electron-carriers are introduced into the drift region 2 by the accumulation effect; if the potential on the high-resistance-conduction region 7 is low, massive hole-carriers are introduced into the drift region 2 by the plasma-injection-efficiency-amplification effect. Hence, no matter what the potential on the electric field intensifier 20 is, the electric field is always introduced into the drift region, which gives higher carrier-density is always realized and therefore higher current density. Although this embodiment has no improvement for the device turn-off characteristics, whereas the number of electrodes for the device is three, which can be driven by the conventional LIGBT driving circuit, but the conduction current density is significantly boosted compared with the conventional LIGBT. Compared to other embodiments, the fabrication process of this embodiment is easiest.

Embodiment 10

Figure 12:
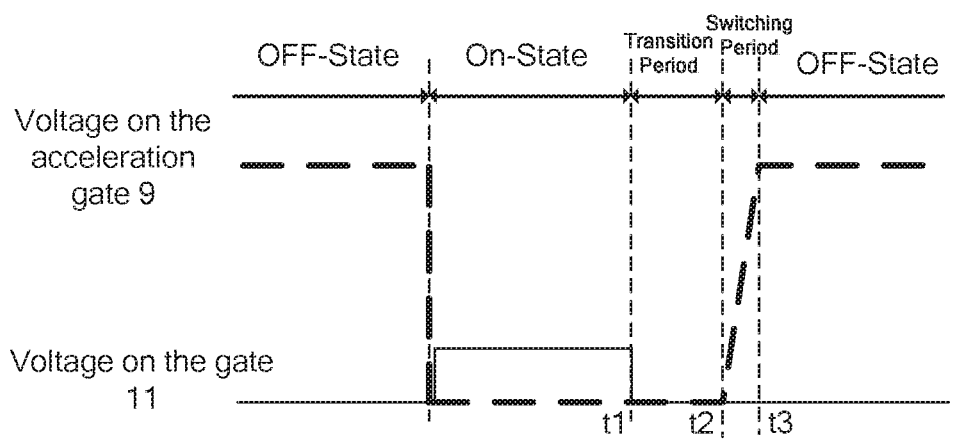
FIG. 12 is the illustration of the voltage sequence on the gate 11 and acceleration gate 9 for the transistor of the embodiment 10 in this invention.

This embodiment relates to the method of eliminating the tail current of the transistor, as shown FIG. 12.

The principle of the invention is as below: when the lateral insulated gate bipolar transistor is shifting from the conducting to the blocking, the gate 11 is firstly grounded to cut the electron channel in the channel region 3, therefore, no more electrons will flow to the drift region 2 from the cathode 5. Whereas the acceleration gate 9 is still grounded, the electric field, which starts from the anode 13 and points to the bottom surface of the electric field intensifier 20 still exist because the entire electric field intensifier 20 is grounded. As a result, the hole current continues to follow from the anode 13 to the cathode 5, which rapidly neutralizes the extra electrons residing in the drift region 2, and the tail current is therefore completely eliminated to realize fast switching off for the lateral insulated gate bipolar transistor.

The switching process for the conventional lateral insulated gate bipolar transistor is as follow: after the gate 11 receives the turn-off signal, because there are external electrons remaining in the drift region 2, their movement towards the anode 13 causes the tail current. This invention uses the specific electric field to introduce the extra hole-carriers into the drift region 2 and keep the flowing of the hole current from the anode 13 to cathode 5. Hence, electrons are rapidly neutralized by the hole current; consequently, the density of the electrons remaining in the drift region is sharply reduced. Furthermore, as the acceleration gate 9 is placed on the drift region 2 of the lateral insulated gate bipolar transistor, once the density of the electrons in the drift region 2 is low enough, a fast rising voltage is applied on the acceleration gate 9, and the voltage is immediately coupled to the anode 13 through the parasitic capacitor 19, as a result, the voltage on the anode 13 also rises sharply, which completely solves the issue of the tail current and realizes the fast switching of the device.

Specifically, the turn-off process in this invention comprises following steps:

1) An electric field in generated that starts from the anode 13 and points to the bottom surface of the electric field intensifier 20, the transistor starts its turn-off process from the conduction status;

This electric field exists between the anode 13 with relatively high potential and region that with relatively low potential, the acceleration gate 9 is placed in that "relatively low potential region" at the side of the anode 13, in order to generate that electric field, the acceleration gate 9 must be grounded or negatively biased.

A fast rising voltage is introduced on the acceleration gate 9 that placed on the drift region 2. The voltage on the acceleration gate 9 lasts until the transistor is fully turned-off.

The sequential voltage changes on the gate 11 and the acceleration gate 9 is shown in FIG. 12.

At the t1, the gate 11 receive the signal for turn-off, the voltage on the gate 11 is biased at the ground.

During the period from t1 to t2, the voltage on both of the gate 11 and the acceleration gate 9 are biased to the ground, at this moment, the hole current introduced by the acceleration gate 9 rapidly neutralizes the all or most of the extra electron carriers in the drift region 2.

During the period from t2 to t3, the voltage on the acceleration gate 9 shifts from low to high. Because the parasitic capacitor exists between the acceleration-gate region 15 and anode 13, the voltage couple from the acceleration gate 9 to the anode 13, as a result, the voltage on the anode 13 rises rapidly. A capacitor that connecting the acceleration gate 9 and the anode contact 10 can be added to compensate the low capacitance of the parasitic capacitor. The capacitor 19 can be the discrete or integrated device, as shown in FIG. 5.

For example, the duration from t1 to t2 (t2-t1) is 1-300 ns, the duration from t2 to t3 (t3-t2) is 1-200 ns.

Embodiment 11

Figure 13:
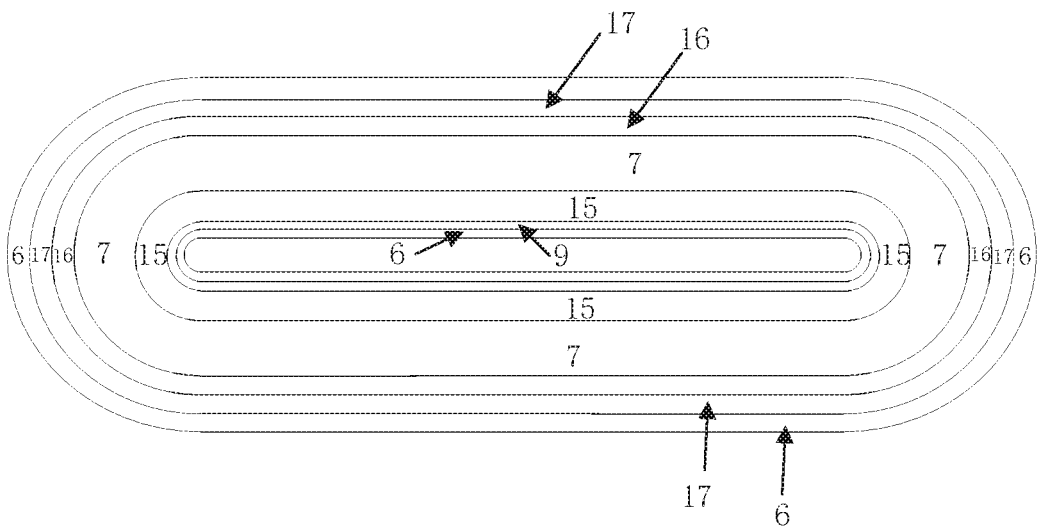
FIG. 13-FIG. 16 are the illustrations of the electric field intensifier 20 layout for the embodiment 11.
Figure 14:
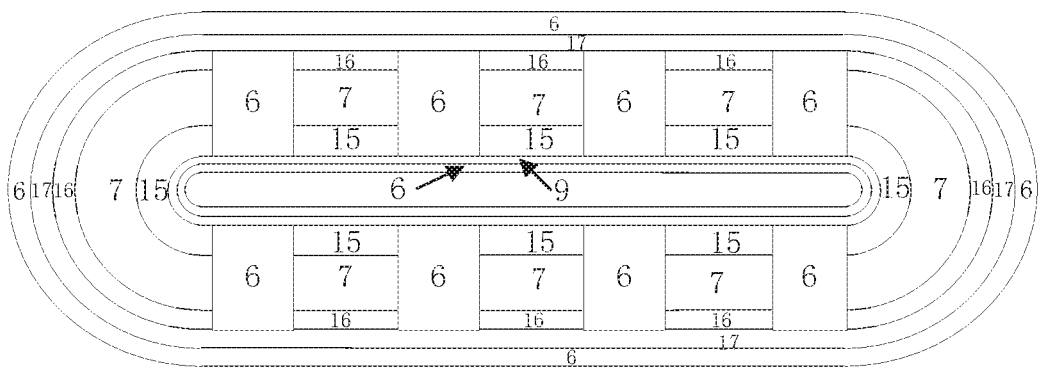
Figure 15:
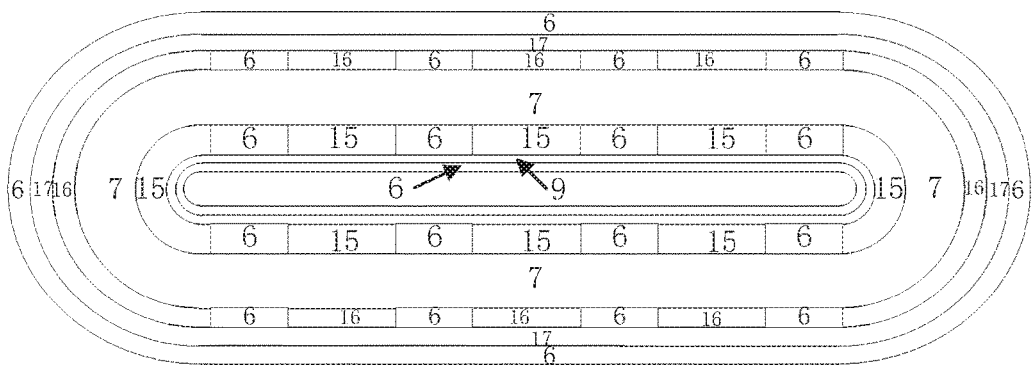
Figure 16:
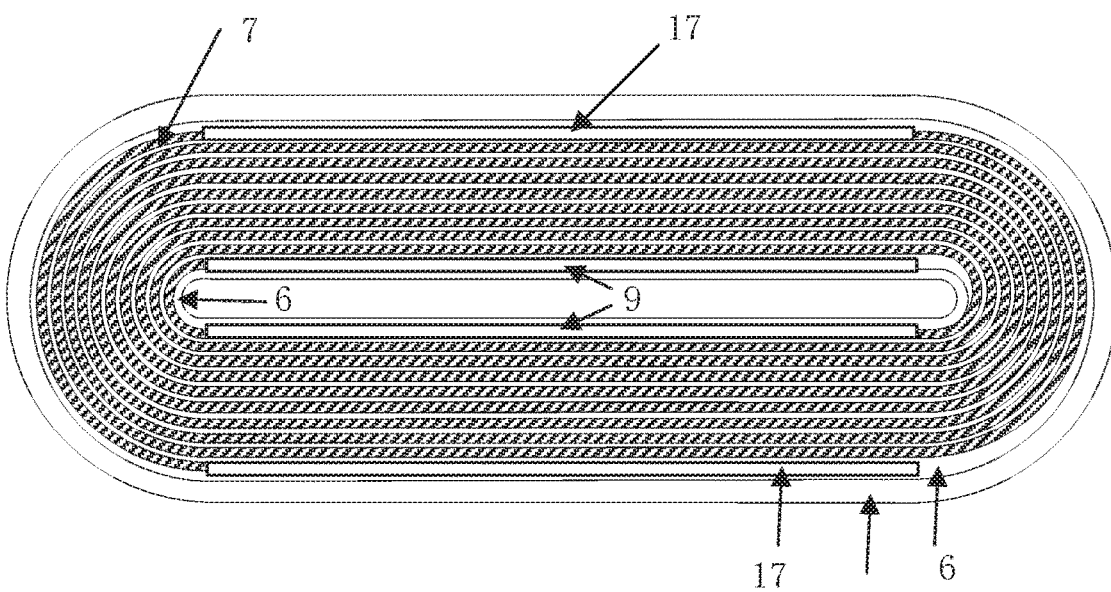

This embodiment relates to the layout of the electric field intensifier 20 on the dielectric 6, as shown FIG. 13, FIG. 14, FIG. 15, and FIG. 16. One possible layout is to have the ground region 16, the high-resistance-conduction region 7, and the acceleration-gate region 15, uniformly and fully deposited on the dielectric 6, as FIG. 13 shows. This layout provides the most stable performance for the device, however, if the polysilicon is used as the material for the ground region 16, the high-resistance-conduction region 7, the acceleration-gate region 15, the reversely leakage current on the electric field intensifier 20 at the blocking state exists. It is possible to reduce that leakage current with the layout as shown in FIG. 14 and FIG. 15, where the ground region 16, the high-resistance-conduction region 7, the acceleration-gate region 15 are partially covered on the dielectric 6. The electric field introduced by the layouts in FIG. 14 and FIG. 15 are weaker than that of the FIG. 13, which causes the inferior device on-state and switching performance. However, because the ground region 16, the high-resistance-conduction region 7, the acceleration-gate region 15 in the FIG. 14 and FIG. 15 take less area than that of the FIG. 13, the leakage current at the blocking state in FIG. 14 and FIG. 15 is much smaller than that of the FIG. 13. The layout for the ground region 16, the high-resistance-conduction region 7, and the acceleration-gate region 15 in the shape of the spiral is another possible option. This layout exhibits the long high-resistance-conduction region 7, which further reduces the leakage current at the blocking state.

What is claimed is:

1. A lateral insulated gate bipolar transistor, comprising a substrate, a drift region, a channel region, a ohm-contact-high-doping region, a cathode, a gate dielectric, an anode contact, a gate, a cathode contact and an anode that locate above the substrate, wherein an electric field intensifier is placed at a surface of the drift region between the anode and the channel region, the electric field intensifier is configured to introduce an electric field that starts from the anode, points to a bottom surface of the electric field intensifier, the electric field intensifier is isolated from the drift region by a dielectric, and wherein the electric field intensifier comprises: a high-resistance-conduction region, an acceleration-gate region and an acceleration gate, the acceleration-gate region contacts the high-resistance-conduction region and locates in a first end of the high-resistance-conduction region at a side of the anode, the acceleration gate contacts the acceleration-gate region.

2. The lateral insulated gate bipolar transistor according to claim 1, wherein the electric field intensifier further comprises: a ground region and a ground electrode; the ground region contacts the high-resistance-conduction region and locates in a second end of the high-resistance-conduction region at a side of the channel region, and the ground electrode contacts the ground region.

3. The lateral insulated gate bipolar transistor according to claim 1, wherein a material of the acceleration-gate region, a material of a ground region, and a material of the high-resistance-conduction region are N or P type semiconductor, a doping type of the acceleration-gate region, the ground region, and the high-resistance-conduction region are the same or different with each other, a doping concentration of the acceleration-gate region and the ground region are the same or higher than a doping concentration of the high-resistance-conduction region.

4. The lateral insulated gate bipolar transistor according to claim 1, wherein a projection of the acceleration-gate region on an upper surface of the drift region tangents or partially overlaps with a projection of the anode on the upper surface of the drift region.

5. The lateral insulated gate bipolar transistor according to claim 2, wherein a projection of the ground region on an upper surface of the drift region tangents to a projection of the channel region on the upper surface of the drift region.

6. The lateral insulated gate bipolar transistor according to claim 2, wherein a distance between projections of the ground region and the channel region on an upper surface of the drift region is equal to or larger than zero.

7. The lateral insulated gate bipolar transistor according to claim 1, wherein the electric field intensifier is embedded into the dielectric, the dielectric isolates the electric field intensifier from other parts of the lateral insulated gate bipolar transistor.

8. The lateral insulated gate bipolar transistor according to claim 1, wherein a buried oxide is located above the substrate, and the drift region, the channel region, the ohm-contact-high-doping region, the cathode, the gate dielectric, the anode contact, the gate, the cathode contact and the anode are placed above the buried oxide.

9. A method of eliminating transistor tail current, comprising the lateral insulated gate bipolar transistor of claim 1, wherein the method comprises following steps: 1) the gate is firstly grounded to cut an electron channel while the keeping the acceleration gate grounded, the electric field that starts from the anode and points to the bottom surface of the electric field intensifier is introduced, a hole-current keeps flowing with an effect of the electric field, electron carriers are significantly reduced or eliminated by the hole current in the drift region; 2) a fast rising voltage is applied on the acceleration gate until the lateral insulated gate bipolar transistor is completely turned-off.

10. The method of eliminating the transistor tail current according to claim 9, wherein a projection of the acceleration-gate region that contacts the acceleration gate, tangents or partially overlaps with a projection of the anode on an upper-surface plane of the drift region.

11. The lateral insulated gate bipolar transistor according to claim 2, wherein a material of the acceleration-gate region, a material of the ground region, and a material of the high-resistance-conduction region are N or P type semiconductor, a doping type of the acceleration-gate region, the ground region, and the high-resistance-conduction region are the same or different with each other, a doping concentration of the acceleration-gate region and the ground region are the same or higher than a doping concentration of the high-resistance-conduction region.

* * * * *